United States Patent
Park

(10) Patent No.: US 8,113,144 B2
(45) Date of Patent: Feb. 14, 2012

(54) PHOTORESIST-COATING AND PHOTORESIST-COATING METHOD USING THE SAME

(75) Inventor: Jae-Yeol Park, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 528 days.

(21) Appl. No.: 12/314,446

(22) Filed: Dec. 10, 2008

(65) Prior Publication Data

US 2009/0274828 A1 Nov. 5, 2009

(30) Foreign Application Priority Data

Apr. 30, 2008 (KR) .................. 10-2008-0040384

(51) Int. Cl.
 *B05C 11/00* (2006.01)
 *B05B 3/00* (2006.01)
(52) U.S. Cl. ......... 118/712; 118/669; 118/665; 118/323
(58) Field of Classification Search .......... 118/300, 118/668–70, 663–665, 321, 323, 52, 612; 427/427.2; 324/754, 765; 239/601
See application file for complete search history.

(56) References Cited

U.S. PATENT DOCUMENTS

| 2005/0140911 A1* | 6/2005 | Ryu et al. .................. 349/153 |
| 2006/0292295 A1* | 12/2006 | Kwon et al. ................ 427/162 |
| 2006/0292458 A1* | 12/2006 | Tsutsui et al. ................ 430/5 |
| 2007/0237385 A1* | 10/2007 | Kato ....................... 382/149 |

FOREIGN PATENT DOCUMENTS

| JP | 2005-085773 | 3/2005 |
| JP | 2007-088375 | 4/2007 |
| JP | 2007-513385 | 5/2007 |

* cited by examiner

*Primary Examiner* — Yewebdar Tadesse
(74) *Attorney, Agent, or Firm* — McKenna Long & Aldridge, LLP

(57) ABSTRACT

A photoresist-coating apparatus includes a substrate on which a particle-detecting area and an invalid particle-detecting area are defined, a nozzle discharging photoresist to the substrate and moving along a direction, and a particle-detecting sensor controlling on and off of the nozzle in the particle-detecting area according to presence of particles, wherein in the invalid particle-detecting area, the nozzle operates independently from detection of the particle-detecting sensor.

5 Claims, 7 Drawing Sheets

PHOTORESIST-COATING AND PHOTORESIST-COATING METHOD USING THE SAME

This application claims the benefit of Korean Patent Application No. 2008-0040384, filed on Apr. 30, 2008, which is hereby incorporated by reference for all purposes as if fully set forth herein.

BACKGROUND OF THE INVENTION

1. Field of the Invention

The present invention relates to a photolithography process, and more particularly, to a photoresist-coating apparatus and a photoresist-coating method using the same.

2. Discussion of the Related Art

With the rapid development of information technology, flat panel display (FPD) devices having advantages of thin thicknesses, light weights and low power consumption, have been developed and have replaced cathode ray tubes (CRTs). The FPD devices include liquid crystal display (LCD) devices, plasma display panels (PDPs), electroluminescent display (ELD) devices and field emission display (FED) devices.

An FPD device may be manufactured through a substrate-fabricating process for forming first and second substrates and a cell process for completing the FPD device by attaching two substrates with a phosphoric material layer or a polarizing material layer therebetween.

In general, to shorten processes and improve production yields, the substrate-fabricating process and the cell process may proceed over large-sized substrates, each of which may include a plurality of cells corresponding to respective display panels and may be referred to as a mother glass substrate.

According to this, in the substrate-fabricating process, thin film deposition, photolithography and etching steps may be repeatedly performed over first and second large-sized substrates to form elements such as pixels and thin film transistors in each cell area.

Meanwhile, in the cell process, seal patterns for attaching substrates may be formed on one of the first and second large-sized substrates, the first and second large-sized substrates may be attached with a polarization material layer, for example, therebetween, and the attached large-sized substrates may be cut by each cell to obtain a plurality of flat panel display devices.

Here, the photolithography step includes applying photoresist to a substrate which includes a thin film thereon, exposing the photoresist to light through a mask which includes predetermined patterns, and developing the light-exposed photoresist to thereby form photoresist patterns corresponding to the patterns of the mask.

At this time, to apply the photoresist to the substrate, a spin coating method or a slit coating method may be used. In the spin coating method, the photoresist may be dropped on the substrate, and then the substrate may be turned, so that the photoresist may be uniformly applied to the substrate. In the slit coating method, the photoresist may be applied to the substrate by scanning a nozzle which has a slit shape along a direction and discharging the photoresist through the nozzle.

The spin coating method has an advantage that the substrate can be uniformly coated with the photoresist. However, as the size of the substrate increases to provide a large-sized display device, the substrate gets large and heavy, and thus it is difficult to turn the substrate. Accordingly, recently, the slit coating method has been widely used.

FIG. 1 is a view of illustrating a slit coating apparatus according to the related art.

In FIG. 1, a substrate 2 to be processed is disposed on a stage 10, and a slit coating apparatus 20 for applying photoresist to the substrate 2 is disposed over the stage 10.

The slit coating apparatus 20 includes a storage unit 30, a supply channel 34 and a nozzle 36. The storage unit 30 stores and supplies photoresist. The supply channel 34 provides a path of the photoresist from the storage unit 30 to the nozzle 36. The nozzle 36 discharges the photoresist to the substrate 2 on the stage 10.

The nozzle 36 may be a slit nozzle having a bar shape across and over the substrate 10. The nozzle 36 scans and moves along a direction and discharges the photoresist on a substantially entire surface of the substrate 2, thereby coating the substrate 2 with the photoresist.

However, the related art slit coating apparatus 20 has several disadvantages.

More particularly, even though particles exist on the substrate 2, the related art slit coating apparatus 20 does not have any means settling the matter, and a photoresist layer may be non-uniformly formed. To solve the problem, the slit coating apparatus 20 may include a particle-detecting sensor (not shown), and the particles on the substrate 2 can be detected by the particle-detecting sensor. However, there frequently happens misoperation of the particle-detecting sensor.

As a first cause of the misoperation, the substrate 2, on which a photoresist layer is formed by the slit coating apparatus 20, may be a mother glass substrate and may be cut into a plurality of cell areas, each of which constitutes one display panel, in the following cutting step. The particle-detecting sensor may misoperate due to interference phenomenon from difference between layers in the cell areas and in regions between adjacent cell areas. That is, layers formed in each cell area differ from layers in the region between adjacent cell areas.

Second, to uniformly apply the photoresist to the substrate 2, the nozzle 36 may accelerate or decelerate at a specific area. At this time, even though there is no particle, the particles-detecting sensor may perceive that there exist particles due to acceleration or deceleration of the nozzle 36 and may misoperate.

When the particle-detecting sensor misoperates, an operator does not judge that the particle-detecting sensor misoperates but judges that there exist particles on the substrate 2. Accordingly, after stopping the slit coating process, the particles on the substrate 2 are checked. Therefore, the efficiency of the process is lowered.

SUMMARY OF THE INVENTION

Accordingly, the present invention is directed to a photoresist-coating apparatus and photoresist-coating method using the same that substantially obviates one or more of the problems due to limitations and disadvantages of the related art.

An advantage of the present invention is to provide a photoresist-coating apparatus and a photoresist-coating method using the same that exactly detect particles on a substrate and uniformly form a photoresist layer.

Another advantage of the present invention is to provide a photoresist-coating apparatus and a photoresist-coating method using the same that prevent misoperation of a particle-detecting sensor and improve production yields.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a photoresist-coating apparatus includes a substrate on which a particle-detecting area and an invalid particle-detecting area are defined, a nozzle discharging photoresist to the substrate and moving along a direction, and a particle-detecting sensor controlling on and off of the nozzle in the particle-detecting area according to presence of particles, wherein in the invalid particle-detecting area, the nozzle operates independently from detection of the particle-detecting sensor.

In another aspect of the present invention, a photoresist-coating method includes discharging photoresist to a substrate by a nozzle moving along a direction while a particle-detecting sensor detects particles on the substrate, wherein a particle-detecting area and an invalid particle-detecting area are defined on the substrate, and in the invalid particle-detecting area, discharging photoresist is performed independently from detection of the particle-detecting sensor.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Reference will now be made in detail to embodiments of the present invention, examples of which are illustrated in the accompanying drawings.

Figure 1:
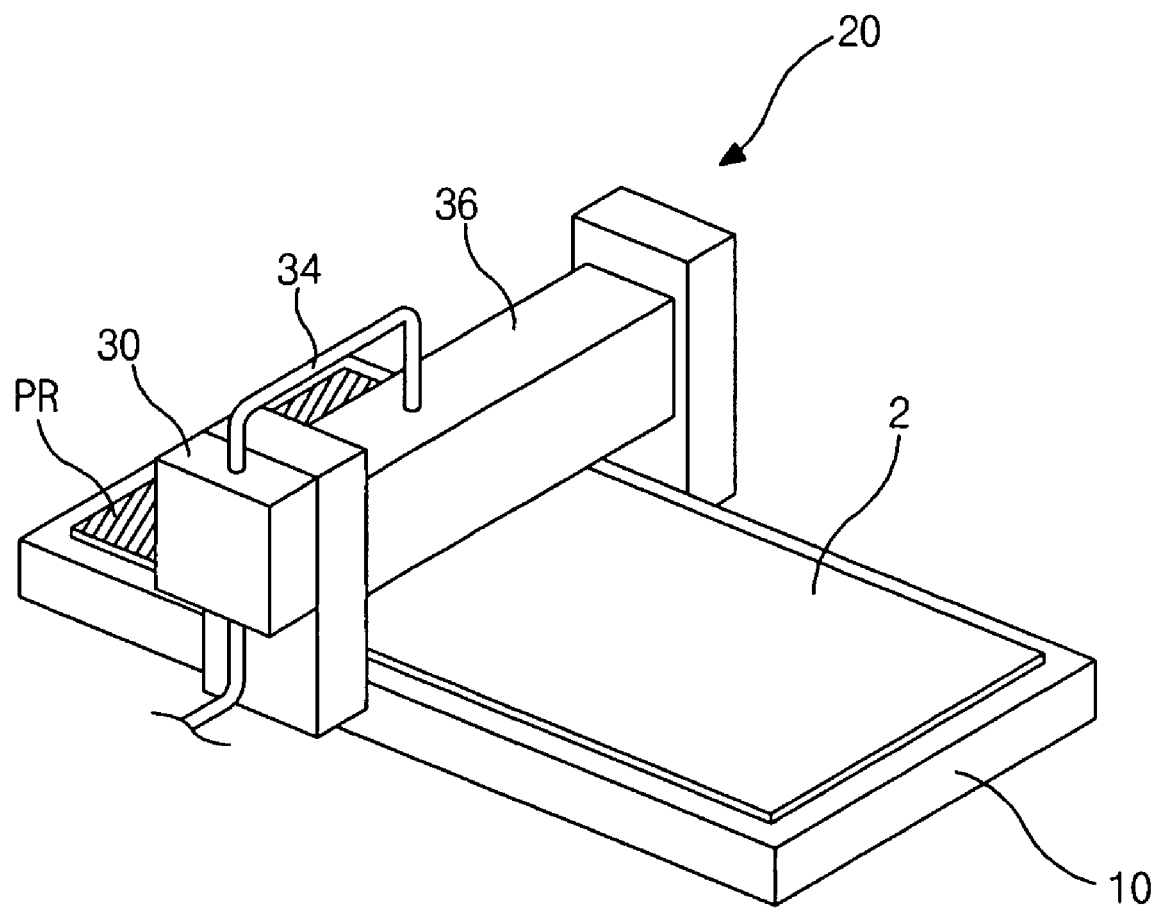
FIG. 1 is a view of illustrating a slit coating apparatus according to the related art.
Figure 2:
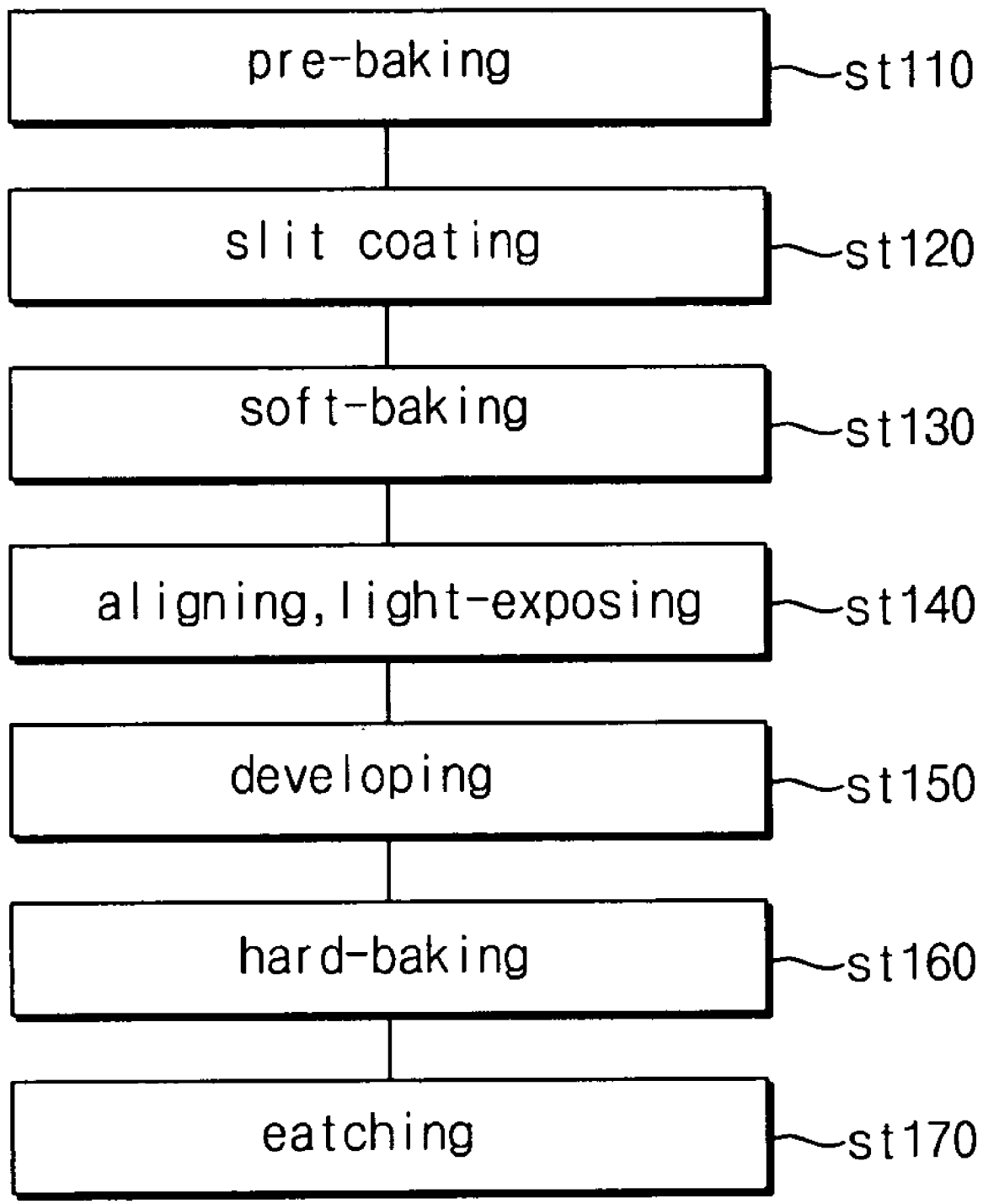
FIG. 2 is a flow chart showing a photolithography process according to an exemplary embodiment of the present invention.

FIG. 2 is a flow chart showing a photolithography process according to an exemplary embodiment of the present invention.

In FIG. 2, the photolithography process is largely divided into coating, light-exposing, developing and baking steps, and the baking step includes pre-baking, soft-baking and hard-baking steps.

At first step st110, pre-baking step is performed. Here, moisture remaining in a thin film deposited on a substrate may be removed, and an adhesive strength between the thin film on the substrate and a photoresist to be formed later may be improved.

At second step st120, photoresist is applied to the substrate by a slit coating method. The photoresist may be discharged through a nozzle having a slit shape and scanning along a direction over the substrate, and the photoresist may be uniformly applied to the substrate to form a photoresist layer.

At third step st130, soft-baking is performed. To vaporize volatile components such as solvent of the photoresist, the soft-baking step may be carried out in an in-line system using a substrate-heating apparatus such as a hot plate under the atmosphere condition.

Next, at fourth step st140, aligning and light-exposing are performed. The substrate passing through the vaporizing step may be aligned with a mask, and the substrate may be exposed to light through the mask to transfer patterns of the mask to the substrate. Here, the photoresist layer may include a first portion, which is exposed to the light and is chemically changed, and a second portion, which is not exposed to the light.

At fifth step st150, the first portion or the second portion of the photoresist layer is selectively removed by a developer depending on the type of the photoresist layer, and photoresist patterns corresponding to the patterns of the mask are formed.

At sixth step st160, hard-baking is performed. The substrate may be heated so that the volatile elements in the photoresist patterns are completely removed. Accordingly, the photoresist patterns become dense and uniform.

According to the first to sixth steps st110 to st160, the thin film is selectively exposed by the photoresist patterns.

At seventh step st170, the exposed portions of the thin film are removed, and then the remaining photoresist patterns are removed. Therefore, intended patterns are obtained.

In the second step st120, a slit coating apparatus according to embodiments of the present invention may be used for applying the photoresist to the substrate that accurately detects particles on the substrate and enables the photoresist layer to be uniformly formed on the substrate.

Figure 3:
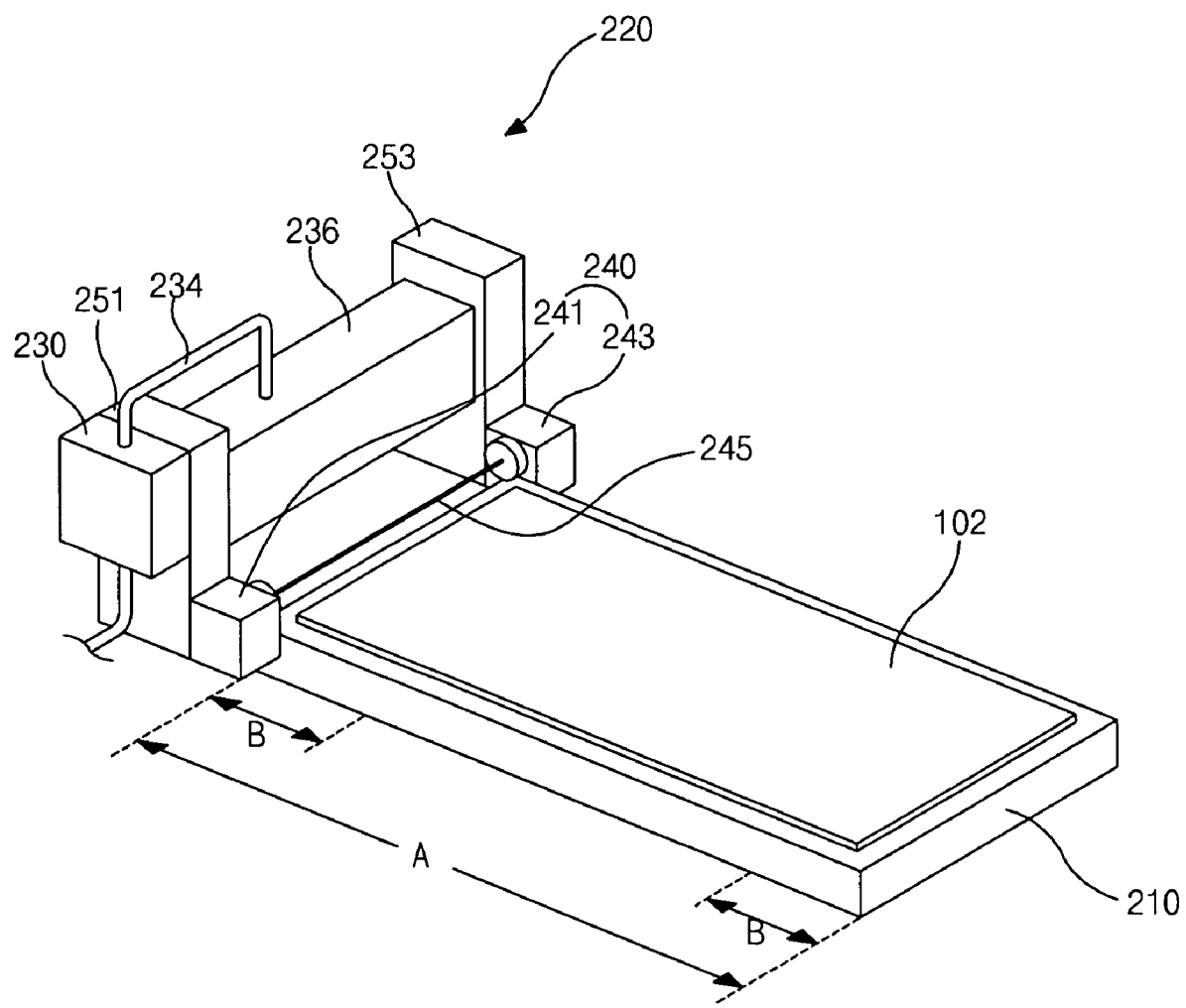
FIG. 3 is a view of schematically illustrating a slit coating apparatus according to an exemplary embodiment of the present invention.

FIG. 3 is a view of schematically illustrating a slit coating apparatus according to an embodiment of the present invention and also shows a substrate on which a photoresist layer is formed by the slit coating apparatus.

In FIG. 3, a substrate 102 to be processed is disposed on a stage 210, and a slit coating apparatus 220 for applying photoresist to the substrate 102 is disposed over the stage 210.

The slit coating apparatus 220 includes a storage unit 230, a supply channel 234, a nozzle 236, a thickness-measuring sensor (not shown) and a particle-detecting sensor 240. The storage unit 230 includes stores and supplies photoresist. The supply channel 234 provides a path of the photoresist from the storage unit 230 to the nozzle 236. The nozzle 236 discharges the photoresist to the substrate 102 on the stage 210. The thickness-measuring sensor measures the thickness of the substrate 102. The particle-detecting sensor 240 detects particles on the substrate 102.

The storage unit 230 may include at least one canister (not shown) for storing the photoresist and a pressing means (not shown) such as a pump for providing the photoresist to the supply channel 234. The supply channel 234 may include a connecting pipe.

The storage unit 230 supplies the nozzle 236 with the photoresist through the supply channel 234 and applies pressure to the photoresist such that the photoresist is discharged to the outside.

The nozzle 236 may be a slit nozzle having a bar shape across and over the substrate 102 with a length corresponding to the substrate 102. The nozzle 236 may include a discharging hole (not shown) having a slit shape at a lower surface of the nozzle 236 facing the substrate 102. A uniform amount of photoresist may be discharged to the substrate 102 through the discharging hole.

The nozzle 236 scans and moves from one side to the other side of the substrate 102 and discharges the photoresist to a substantially entire surface of the substrate 102 to coat the substrate 102 with the photoresist while both ends of the nozzle 236 are supported by a couple of nozzle-transporting units 251 and 253.

Alternatively, the photoresist may be applied to the substrate 102 by sliding the substrate 102 on the stage 210 while the nozzle 236 is fixed.

The thickness-measuring sensor (not shown) measures the thickness of the substrate 102 to be coated with the photoresist and controls a distance between the substrate 102 and the nozzle 236 according to the measured thickness of the substrate 102.

At this time, the distance between the substrate 102 and the nozzle 236 may be minutely adjusted considering the viscosity and the amount of the photoresist to be applied. Since the photoresist is dried right after being applied to the substrate 102, the viscosity of the applied photoresist may be changed as time passes. Therefore, the distance between the nozzle 236 and the substrate 102 should be minutely controlled.

The nozzle 236 waits while the thickness of the substrate 102 is measured by the thickness-measuring sensor, and after measuring the thickness of the substrate 102, the nozzle 236 scans and moves.

In addition, a light-emitting portion 241 and a light-receiving portion 243 of the particle-detecting sensor 240 are installed in front of the couple of nozzle-transporting units 251 and 253 supporting both ends of the nozzle 236, respectively. Light 245 emitted from the light-emitting portion 241 is received by the light-receiving portion 243, and thus the amount of light is determined. The light 245 may be a laser beam.

At this time, if there is no particle between the light-emitting portion 241 and the light-receiving portion 243, all the light 245 emitted from the light-emitting portion 241 are incident on the light-receiving portion 243. On the other hand, if there exist particles between the light-emitting portion 241 and the light-receiving portion 243, some of the light 245 emitted from the light-emitting portion 241 are screened by the particles, and only the others of the light 245 are incident on the light-receiving portion 243. Accordingly, the amount of light received by the light-receiving portion 243 is reduced as compared with a normal state, and in this case, it is determined that there exist particles between the light-emitting portion 241 and the light-receiving portion 243.

Like this, if the particles on the substrate 102 are detected by the particle-detecting sensor 240, the slit-coating apparatus 220 stops the slit-coating process by stopping the nozzle 236 from discharging the photoresist and moving and by forcing the nozzle to wait. Then, after the particles detected on the substrate 102 are checked, the particles are removed or the substrate 102 is disused.

At this time, a particle-detecting area A on the substrate 102 is subdivided.

More particularly, to uniformly apply the photoresist to the substrate 102, the nozzle 236 may accelerate or decelerate in a specific area. At this time, the particle-detecting sensor 240 may perceive a minute vibration because of the acceleration or deceleration of the nozzle 236. Accordingly, the amount of light received by the light-receiving portion 243 may change, and the particle-detecting sensor 240 may recognize that there exist particles in areas where the nozzle 236 accelerates or decelerates. Accordingly, the areas where the nozzle 236 accelerates or decelerates are defined as examples of invalid particle-detecting areas B, and the particle-detecting area A is subdivided.

In the invalid particle-detecting areas B, sensing of the particle-detecting sensor 240 is disregarded, and process time is shortened in comparison to the related art. Thus, stops of the slit-coating apparatus 220 due to misoperation of the particle-detecting sensor 240 are decreased.

Figure 4:
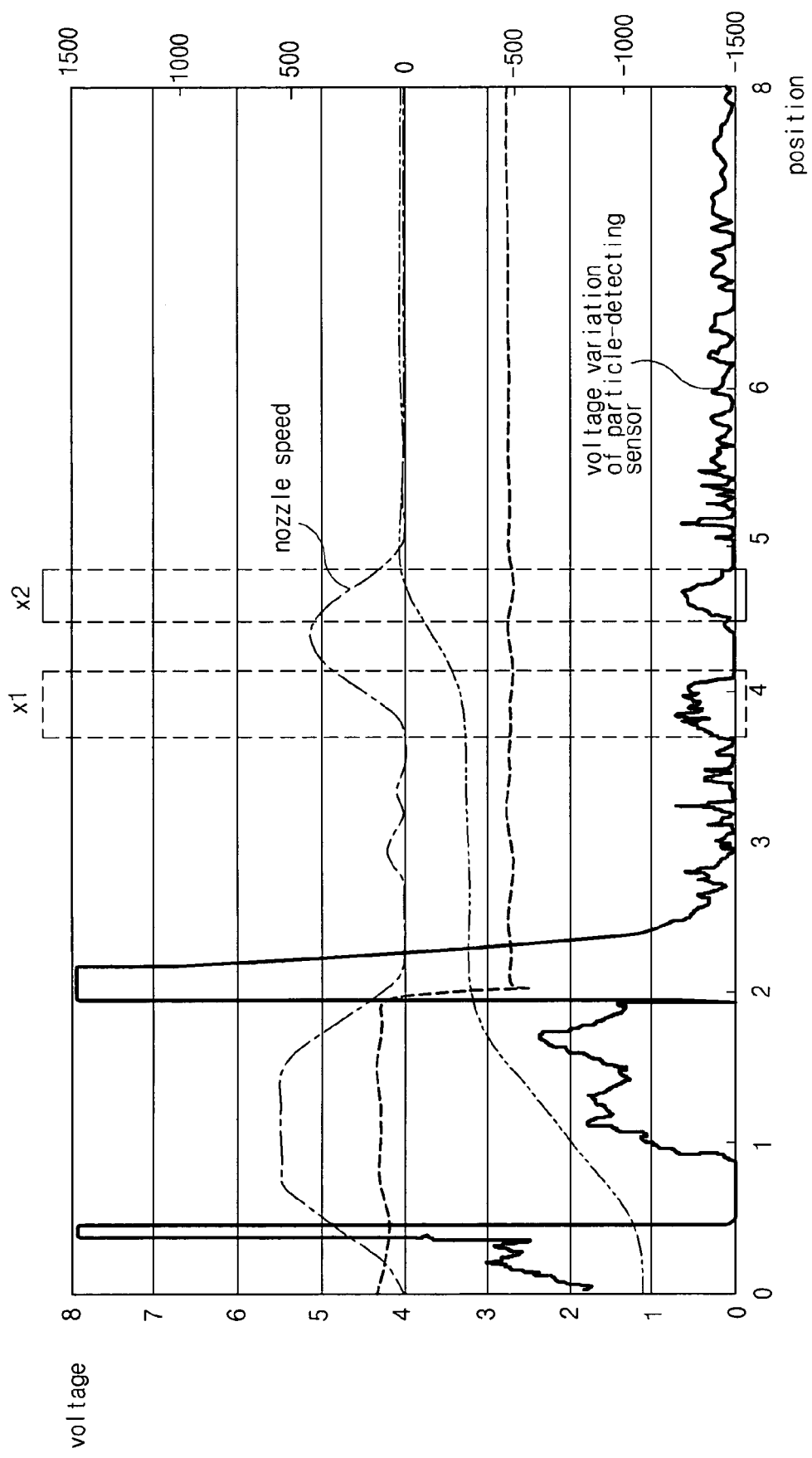
FIG. 4 is a graph of illustrating voltage variation of a particle-detecting sensor in areas where a nozzle accelerates or decelerates.

FIG. 4 is a graph of illustrating voltage variation of a particle-detecting sensor in areas where a nozzle accelerates or decelerates.

In FIG. 4, the nozzle 236 accelerates or decelerates in first and second areas x1 and x2, and at these times, the voltage of the particle-detecting sensor 240 is changed. In general, the voltage variation of the particle-detecting sensor 240 means that the particle-detecting sensor 240 perceives particles on the substrate 102.

However, the first and second areas x1 and x2 in which the nozzle 236 accelerates or decelerates may be areas where the nozzle 236 starts moving at one side of the substrate 102 to discharge the photoresist on the substrate 102 on the stage 210 and where the nozzle 236 stops moving at the other side of the substrate 102 after discharging the photoresist on a substantially entire surface of the substrate 102. Or, the first and second areas x1 and x2 may be areas where the nozzle 236 decelerates so that the thickness of the substrate 102 is measured by the thickness-measuring sensor (not shown) and where the nozzle 236 accelerates to move again after measuring the thickness of the substrate 102 by the thickness-measuring sensor.

That is, the particle-detecting sensor 240 does not detect real particles on the substrate 102, but the particle-detecting sensor 240 misoperates as if the particles are detected due to minute vibration from the acceleration or deceleration of the nozzle 236.

Accordingly, even though the particle-detecting sensor 240 detects particles in the first and second areas x1 and x2 of the graph while the photoresist is uniformly applied to the substrate 102 by the slit-coating apparatus 220, the perception of the particle-detecting sensor 240 is disregarded, and the slit-coating process is normally performed. Here, the first and second areas x1 and x2 become the invalid particle-detecting areas B.

In the meantime, the particle-detecting sensor 240 may include a control unit (not shown) such that the particle-detecting sensor 240 ignores the perception in the invalid particle-detecting areas B and the slit-coating apparatus 220 normally performs the process. The control unit may be a computer, and the areas where the nozzle 236 accelerates or decelerates are defined in the control unit. The particle-detecting sensor 240 may further include a monitor device (not shown) that shows the result of perception of the particle-detecting sensor 240 in the invalid particle-detecting areas B.

Here, the substrate 102 may be a substrate for a liquid crystal display device to be processed by the slit-coating apparatus 220. To reduce the process and increase the production yields, the substrate 102 may be a mother glass substrate including a plurality of cell areas 101, each of which corresponds to a display device.

Figure 5:
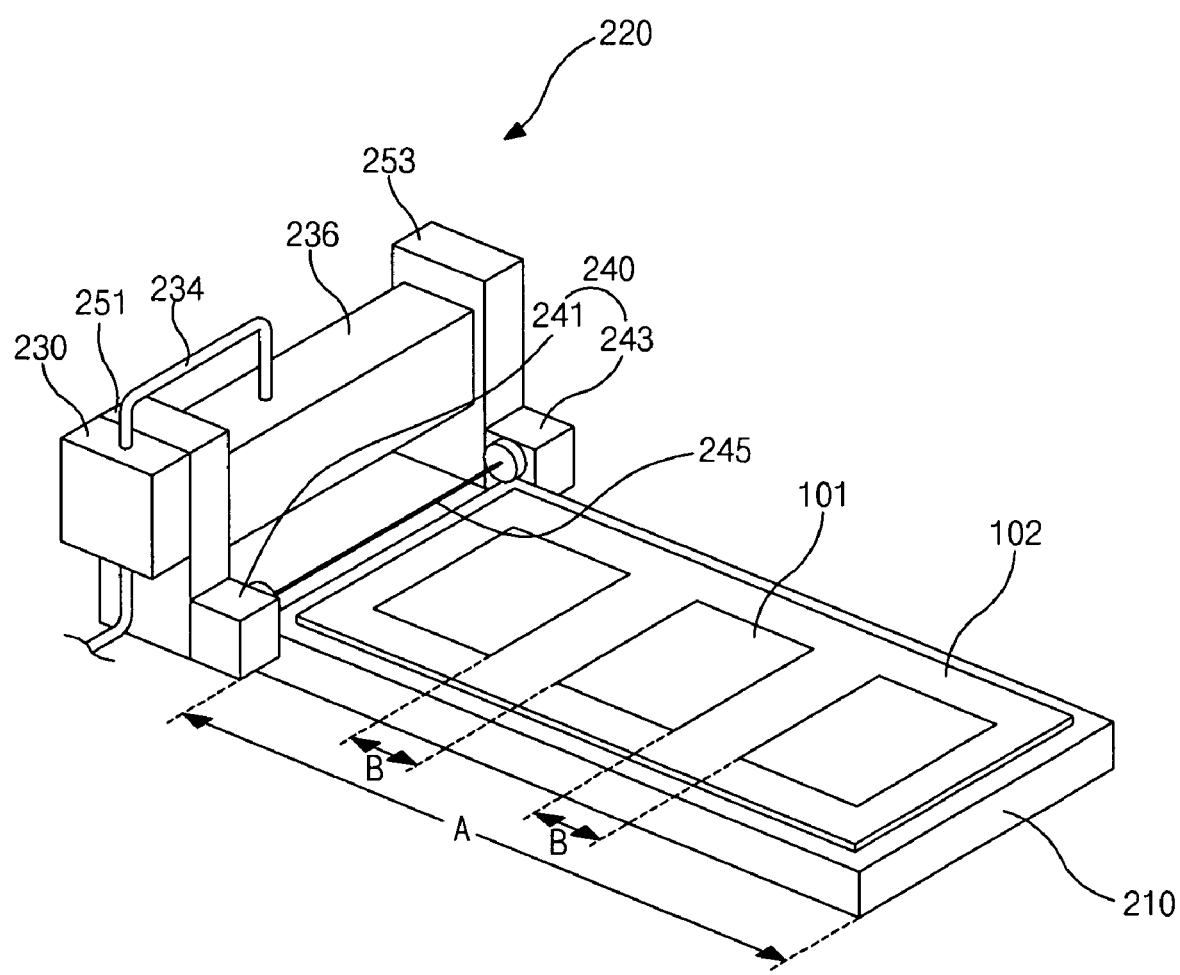
FIG. 5 is a view of schematically illustrating a slit coating apparatus according to an exemplary embodiment of the present invention.

As shown in FIG. 5, in the control unit, areas where there may occur an interference phenomenon due to difference between layers in the cell areas 101 and in regions between adjacent cell areas 101 on the substrate 102 are also defined as the invalid particle-detecting areas B in addition to the areas where the nozzle 236 accelerates or decelerates. Accordingly, the control unit enables the particle-detecting sensor 240 to ignore the perception in the invalid particle-detecting areas B.

As stated above, by defining the invalid particle-detecting areas B and disregarding the perception of the particle-detecting sensor 240 in the areas B, process time is shortened in comparison to the related art, and this is why it is decreased that the slit-coating apparatus 220 stops due to misoperation of the particle-detecting sensor 240.

That is, even though there is no particle, the particle-detecting sensor 240 may misoperate as if the particles are detected due to minute vibration from the acceleration or deceleration of the nozzle 236 and the interference phenomenon by difference between layers in the cell areas 101 and in regions between adjacent cell areas 101 on the substrate 102. At this time, the operator may not judge that the particle-detecting sensor misoperates but may judge that there exist particles on the substrate 102. To check the particles on the substrate 102, the slit coating process may be stopped. Therefore, the efficiency of the process may be lowered. However, in the embodiments of the present invention, problems due to misoperation of the particle-detecting sensor 240 are prevented.

Figure 6A:
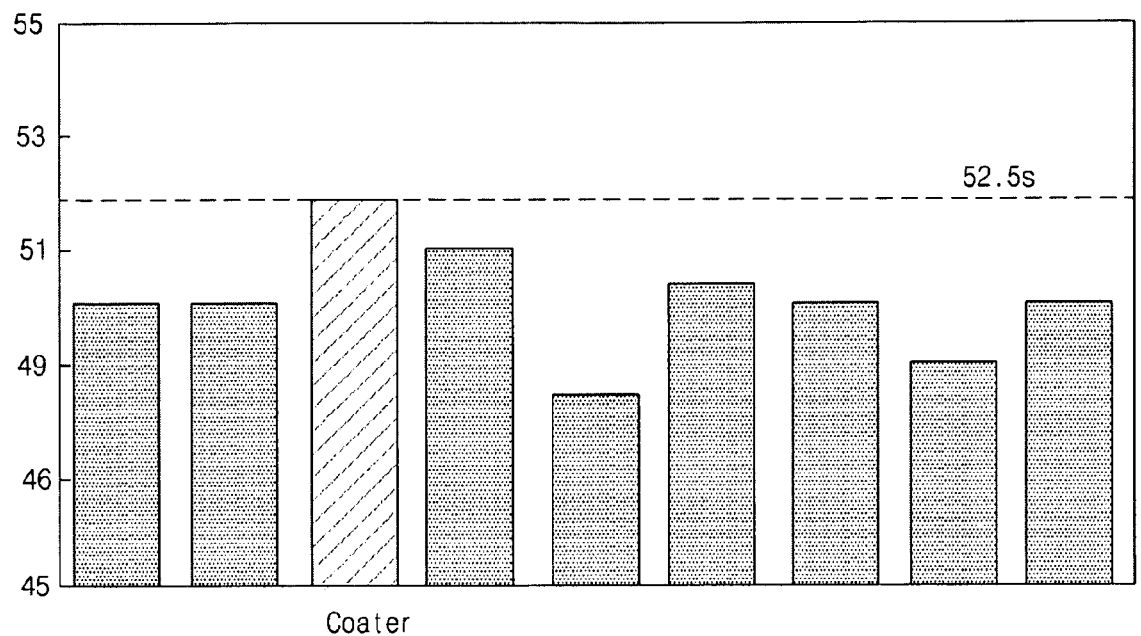
FIG. 6A is a graph of illustrating measured time for each step of a photolithography process using a slit coating method, wherein a particle-detecting sensor detects particles on a substrate without defining invalid particle-detecting areas.
Figure 6B:
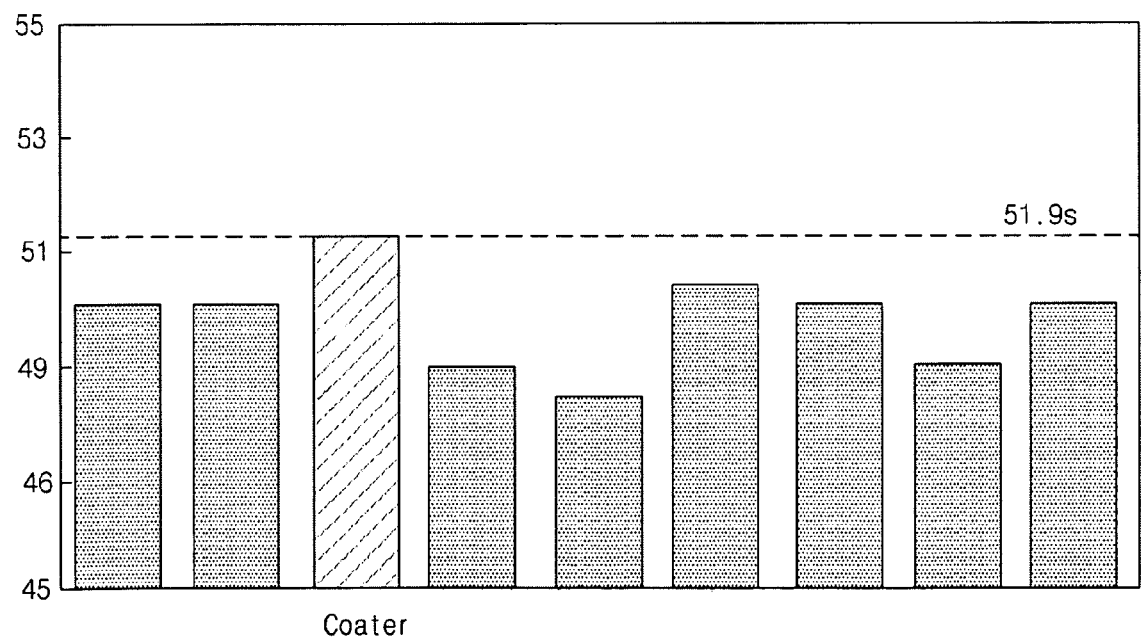
FIG. 6B is a graph of illustrating measured time for each step of a photolithography process using a slit coating method, wherein a particle-detecting sensor detects particles on a substrate with defining invalid particle-detecting areas according to an exemplary embodiment of the present invention.

FIG. 6A is a graph of illustrating measured time for each step of a photolithography process using a slit coating method, wherein a particle-detecting sensor detects particles on a substrate without defining invalid particle-detecting areas. FIG. 6B is a graph of illustrating measured time for each step of a photolithography process using a slit coating method, wherein a particle-detecting sensor detects particles on a substrate with defining invalid particle-detecting areas according to an exemplary embodiment of the present invention.

In FIG. 6A, an average time for each step of the photolithography process is 52.5 seconds. In FIG. 6B, an average time for each step of the photolithography process according to the present invention is 51.9 seconds, which is reduced by 0.6 seconds as compared with the average time for each step of the photolithography process according to the related art in which the invalid particle-detecting areas are not defined.

This is because the process is less often stopped than the related art, in which the whole slit coating process is stopped when the particle-detecting sensor 240 operates as it detects particles due to minute vibration by the acceleration or deceleration of the nozzle 236 or due to difference between layers in the cell areas and in regions between adjacent cell areas on the substrate 102 even if there is no particle in specific areas. Accordingly, process speed can be improved.

Meanwhile, the time measured at each step of the photolithography process in FIGS. 6A and 6B is process time required when the photolithography process is completely performed over one substrate 102. To reduce process time and costs, the photolithography process may be carried out with an in-line system in which the substrate 102 is processed while being transferred. In embodiments of the present invention, the time of the photolithography process over the substrate 102 is reduced by 0.6 seconds, and time of total photolithography processes can be considerably decreased. Accordingly, the production yields of the photolithography process can be rather increased.

Figure 7:
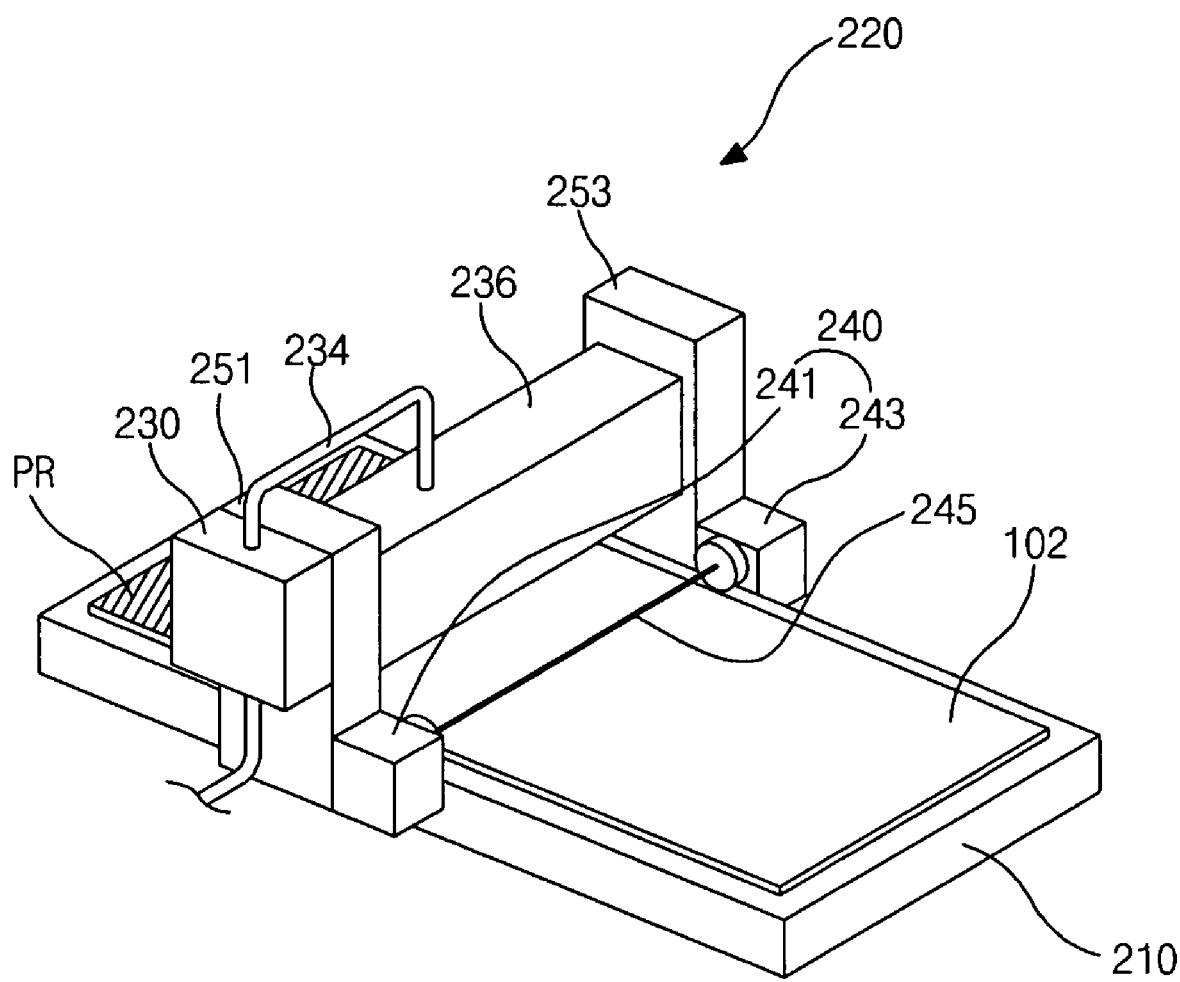
FIG. 7 is a view for explaining a slit coating method according embodiments to the present invention.

FIG. 7 is a view for explaining a slit coating method according to an embodiment of to the present invention.

In FIG. 7, a substrate 102 to be coated with photoresist is disposed on a stage 210, and a nozzle 236 of a slit coating apparatus 220 is disposed over and across the substrate 102.

A thickness of one side of the substrate 102 is measured by a thickness-measuring sensor (not shown) of the slit coating apparatus 220, and then the nozzle 236 scans and moves from one side to the other side of the substrate 102 by a couple of nozzle-transporting units 251 and 253 at a regular speed to thereby discharge and apply photoresist to a substantially entire surface of the substrate 102.

At this time, light 245 such as a laser beam is emitted from a light-emitting portion 241 of a particle-detecting sensor 240, which is installed at one of the moving nozzle-transporting units 251 and 253, and is received by the light-receiving portion 243 of the particle-detecting sensor 240, which is installed at the other of the nozzle-transporting units 251 and 253. According to this, the amount of light is determined, and particles on the substrate 102 can be detected.

In the meantime, when the nozzle 236 scans and moves after the thickness of the substrate 102 is measured by the thickness-measuring sensor (not shown), even though the particle-detecting sensor 240 operates as it detects particles due to minute vibrations from acceleration of the nozzle 236, the nozzle 236 continuously scans and moves over the substrate 102.

Additionally, even though the particle-detecting sensor 240 operates as it detects particles due to minute vibrations from deceleration of the nozzle 236 that reaches the other side of the substrate 102, the nozzle 236 disregards this and completes the coating process over the substrate 102.

That is, the areas where the nozzle 236 accelerates or decelerates are defined as invalid particle-detecting areas B of FIG. 3, and it is disregarded that the particle-detecting sensor 240 detects particles in the areas.

Meanwhile, in addition to the areas where the nozzle 236 accelerates or decelerates, areas where there occurs an interference phenomenon due to difference between layers in cell areas and in regions between adjacent cell areas 101 on the substrate 102 may be also defined as the invalid particle-detecting areas B of FIG. 3.

As stated above, by defining the invalid particle-detecting areas B of FIG. 3, perception of the particle-detecting sensor 240 is disregarded in the invalid particle-detecting areas B of FIG. 3, and process time can be shortened as compared with the related art. Accordingly, problems due to misoperation of the particle-detecting sensor 240 can be prevented. Moreover, process efficiency can be improved.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A photoresist-coating apparatus, comprising:
    a substrate on which a particle-detecting area and an invalid particle-detecting area are defined;
    a nozzle discharging photoresist to the substrate and moving along a direction; and
    a particle-detecting sensor controlling on and off of the nozzle in the particle-detecting area according to presence of particles, wherein in the invalid particle-detecting area, the nozzle operates independently from detection of the particle-detecting sensor, wherein the nozzle accelerates or decelerates in the invalid particle-detecting area.

2. The apparatus according to claim 1, wherein the substrate includes two cell areas, each of which corresponds to a display panel, and the invalid particle-detecting area is between one of the cell areas and a region between the cell areas.

3. The apparatus according to claim 1, further comprising a couple of nozzle-transporting units supporting both ends of the nozzle, respectively.

4. The apparatus according to claim 1, wherein the particle-detecting sensor includes a light-emitting portion and a light-receiving portion.

5. The apparatus according to claim 1, wherein the nozzle is a slit nozzle having a bar shape.

\* \* \* \* \*